United States Patent

Haefele et al.

[11] Patent Number: 6,008,635
[45] Date of Patent: Dec. 28, 1999

[54] ELECTRICITY METER

[75] Inventors: Günter Haefele, Erlangen; Manfred Schwendtner; Rainer Förthner, both of Schwarzenbruck; Klaus Windsheimer, Spalt, all of Germany

[73] Assignee: Siemens Aktiengesellschaft, Munich, Germany

[21] Appl. No.: 09/034,930

[22] Filed: Mar. 4, 1998

Related U.S. Application Data

[63] Continuation of application No. PCT/DE96/01636, Sep. 3, 1996.

[30] Foreign Application Priority Data

Sep. 4, 1995 [DE] Germany .................. 195 32 588

[51] Int. Cl.[6] .................................................. G01R 11/32
[52] U.S. Cl. .......................................... 324/142; 324/107
[58] Field of Search .................................. 324/142, 141, 324/107, 111; 702/60, 61

[56] References Cited

U.S. PATENT DOCUMENTS

| | | | |
|---|---|---|---|
| 3,226,641 | 12/1965 | Miller et al. | 324/142 |
| 4,992,725 | 2/1991 | Komatsu et al. | 324/115 |
| 5,301,121 | 4/1994 | Garverick et al. | 324/142 |
| 5,315,236 | 5/1994 | Lee | 324/142 |

FOREIGN PATENT DOCUMENTS

| | | |
|---|---|---|
| 0437861A2 | 7/1991 | European Pat. Off. . |
| 0634662A1 | 1/1995 | European Pat. Off. . |
| 3727053A1 | 2/1989 | Germany . |
| 9213457 | 3/1993 | Germany . |
| 91/19201 | 12/1991 | WIPO . |

*Primary Examiner*—Diep N. Do
*Attorney, Agent, or Firm*—Herbert L. Lerner; Laurence A. Greenberg

[57] ABSTRACT

An electricity meter with differentiating input converters, in particular current converters, attains improved signal processing by providing a respective analog filter, in particular a low-pass filter, following each of the input converters. In this way, voltage peaks are limited for electronics downstream. Adulteration of measured signals caused by filters is compensated for by a digital filter in a downstream signal processing.

18 Claims, 4 Drawing Sheets

ELECTRICITY METER

CROSS-REFERENCE TO RELATED APPLICATION

This application is a continuation of International Application Serial No. PCT/DE96/01636, filed Sep. 3, 1996, which designated the United States.

BACKGROUND OF THE INVENTION

FIELD OF THE INVENTION

The invention relates to an electricity meter having at least one differentiating input converter, an analog/digital converter downstream of the at least one input converter, one analog filter connected between each respective input converter and the analog/digital converter, a device downstream of the analog/digital converter for digital signal processing, and a digital filter for digital signal processing.

Such an electricity meter is known from U.S. Pat. No. 4,992,725.

In an input circuit of an electricity meter which is known from German Published, Non-Prosecuted Patent Application DE 87 27 053 A1, a differentiating input converter is followed by an integrator with direct-voltage negative feedback. The integrator serves to compensate for the differentiating effect of the input converter. In that example, the integrator is constructed as an operational amplifier with RC wiring in the negative feedback branch. The disadvantage of such circuits is their in long-term drift and the temperature drift in the integration capacitor disposed in the negative feedback branch. In addition, magnetic and electric interference represent a problem for the integrator.

In constructing the meter with digital signal processing, the problem also arises that the components used there are very vulnerable to interference. That applies particularly to voltage peaks, of the kind that occur in differentiating converters, for instance.

U.S. Pat. No. 5,315,236 discloses an electricity meter intended for connection to a differentiating input converter. The input converter is followed by a digital/analog converter and a device for digital signal processing. Connected between the input converter and the digital/analog converter is an analog filter, which is constructed as an active low-pass filter with an amplifier. The device for digital signal processing, constructed as a CPU, is used to calculate current consumption from input data.

The use of sigma-delta converters and multiplexers in three-phase electricity meters is known in principle from European Patent Application 0 634 662 A1.

SUMMARY OF THE INVENTION

It is accordingly an object of the invention to provide an electricity meter with differentiating input converters and digital signal processing, which overcomes the hereinafore-mentioned disadvantages of the heretofore-known devices of this general type and in which a duplicate or copy of a measured signal can be generated in a reliable way, without ensuing signal adulteration.

With the foregoing and other objects in view there is provided, in accordance with the invention, an electricity meter, comprising at least one differentiating input converter; an analog/digital converter downstream of the at least one input converter; analog filters each connected between a respective one of the at least one input converter and the analog/digital converter, the analog filters having a given transfer function; and a device disposed downstream of the analog/digital converter for digital signal processing, the device for digital signal processing having a digital filter, the digital filter integrating a signal previously differentiated in the input converter and subsequently analog filtered and digitized, and the digital filter having a transfer function inverse to the given transfer function.

The filter function of the analog filter provides a limitation for voltage pulses that are output by the input converter. However, the variation in the input signal is defined and is compensated for downstream in the signal processing. In this way, an integrating function for the differentiating input converter and at the same time a protective function for the input region of the electronics is provided.

In accordance with another feature of the invention, the analog filter is an active filter with an amplifier. This permits an additional level adaptation between the input converter and the downstream electronics.

In accordance with a further feature of the invention, the analog filter is a low-pass filter. In this way, special voltage peaks, which occur particularly at the phase shift and have a higher frequency than the mains frequency, are limited.

In accordance with an added feature of the invention, the analog filter is an RC element. This provides for an especially simple embodiment of the filter that can also be made economically. In addition, the components being used do not have to meet such high demands as in the case of an integration capacitor in a circuit according to the prior art, for instance.

In accordance with an additional feature of the invention, the analog filter is a second-order or higher-order limiting filter. In this way, the influence on low frequencies is very slight. Any drift in the capacitors being used has virtually no effect on angle errors.

In accordance with yet another feature of the invention, the analog/digital converter is a sigma-delta converter ($\Sigma\Delta$ converter). In this way, precise and rapid conversion of the input signals is possible, and even the highest demands, such as for precision meters, can be met.

In accordance with yet a further feature of the invention, there is provided a multiplexer connected between the analog filters and the analog/digital converter. In this way, a plurality of input signals can be processed with a single analog/digital converter, and each channel that is formed is adapted with its filter to the applicable signal conditions.

In accordance with yet an added feature of the invention, there are provided at least three input converters for detecting a three-phase input signal. The meter can thus be used in three-phase systems.

In accordance with yet an additional feature of the invention, the device for digital signal processing has a digital signal processor. This makes it simple to realize the filtering and integrating function.

In accordance with again another feature of the invention, the differentiated signal is a current signal.

In accordance with again a further feature of the invention, the device for digital signal processing is additionally supplied with at least one digitized voltage signal of a voltage converter, downstream of which an analog filter is provided, and the voltage signal is carried to the digital filter or to a further digital filter in the device for digital signal processing. In this way, the compensation algorithm in the digital filter can be constructed very simply.

This embodiment pertains to an application in which current and voltage are linked together, such as in a power measurement. Due to the analog filter in the current detection, a phase displacement occurs, which must be taken into account in the digital filter. However, if the same phase displacement occurs for the voltage signal, then the phase displacement in the digital filter can be dispensed with. The digital filter need merely compensate the analog filter in terms of the amount.

In accordance with again an added feature of the invention, the voltage detection is effected in a three-phase manner with three voltage converters, and optionally a zero current can also be detected.

In accordance with a concomitant feature of the invention, there is provided one additional analog/digital converter, optionally preceded by a multiplexer, for the voltage detection. This provides for separate signal detection for current and voltage.

Other features which are considered as characteristic for the invention are set forth in the appended claims.

Although the invention is illustrated and described herein as embodied in an electricity meter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
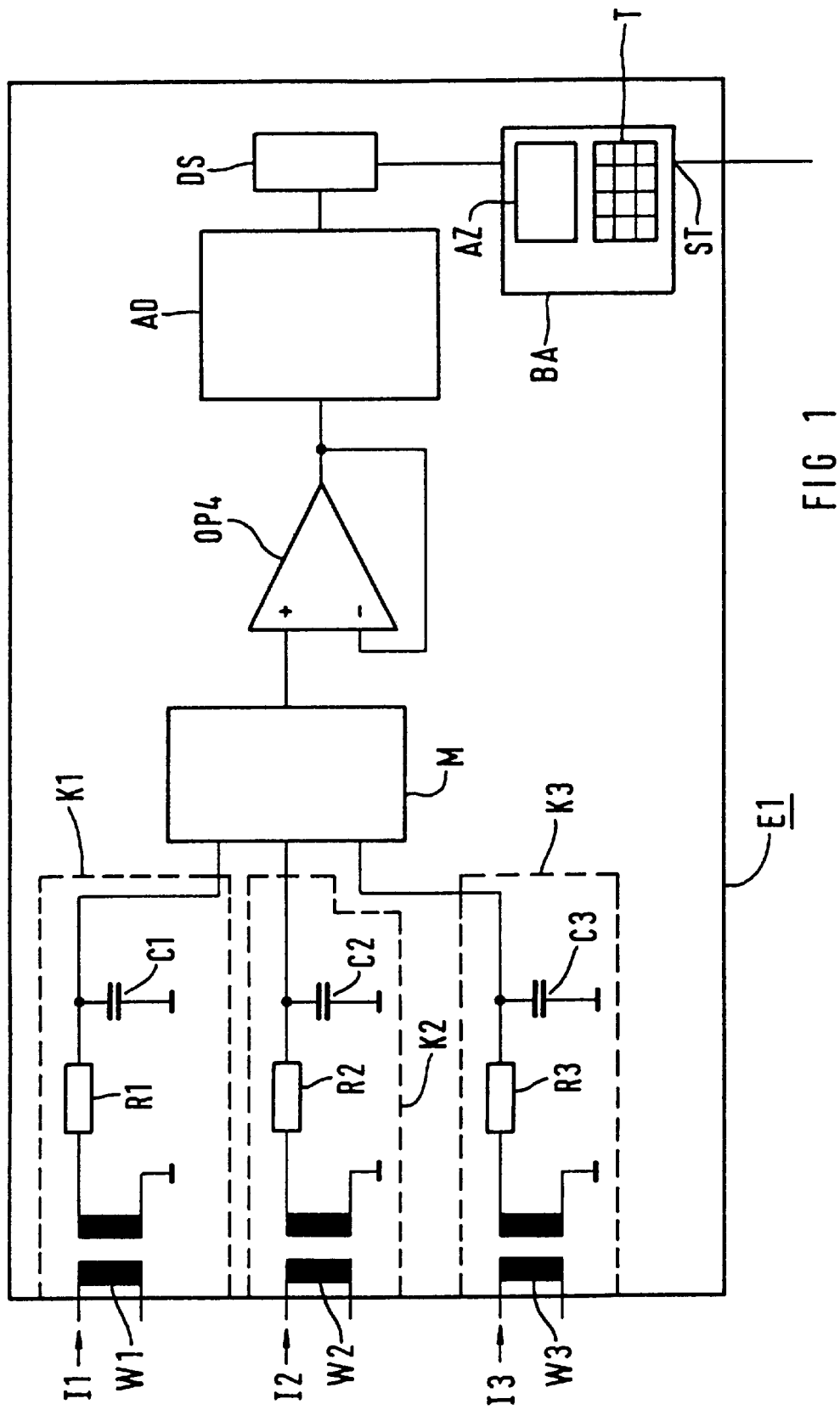
FIG. 1 is a schematic and block circuit diagram of an electricity meter with analog filters.

In the drawing figures described below, details that are the same or function the same are identified with the same reference numerals, and differences between identical details in different channels are sometimes identified by suitable subscripts or additional appended symbols.

Referring now to the figures of the drawings in detail and first, particularly, to FIG. 1 thereof, there is seen an input circuit of an electricity meter E1 which is shown in detail. It has three channels K1, K2, K3, each receiving a respective current signal I1, I2, I3 of a non-illustrated electrical consumer as an input signal. The channel K1 will be described in further detail below for each drawing figure, as an example for all of the channels.

The current signal I1 is first supplied to a differentiating converter W1 in the channel K1. An analog filter which is disposed downstream of the differentiating converter W1 is formed by an RC element having a resistor R1 and a capacitor C1.

This filter is used to limit voltage peaks that occur at an output of the converter W1, peaks that can be as high as several hundred volts and which are very brief in pulse length. Such voltage peaks occur to an increased extent in electrical networks in which phase-shift controls are employed. In that case, in fact, a major change in the current occurs within a short time. These voltage peaks are markedly higher than a voltage range on an input side of downstream electronics, in particular a downstream analog/digital converter (referred to below as a converter AD) and can reach voltage values of up to several hundred volts. Merely lopping off these voltage peaks would cause an unacceptably major adulteration in a measurement signal in an ensuing integration. That would lead to a measurement error in a power or energy measurement.

The channels K1, K2, K3 are connected to one common multiplexer M, having an output signal which is supplied through an operational amplifier OP4 with negative feedback, to the converter AD. An output of the converter AD is carried to a device DS for digital signal processing, which performs data-specific processing of the digitized current signals I1–I3. Consumer metering, error monitoring, or other functions essential for protection or counting purposes can be performed in this processing. It is understood that in order to calculate power, the device DS can also be supplied with additional voltage signals of the respective consumer through non-illustrated channels. By way of example, the digital device DS may be constructed as a digital signal processor or as a computation device with a microprocessor.

The device DS is followed downstream by an input and display device BA, which includes an operator control device, such as a keyboard T and a display device AZ. The operator control and display device or configuration BA can also have an interface ST, which is used for data exchange, for instance with a hand-held terminal or higher-level control devices for remote polling.

An integration function is realized in the device DS through the use of a digital filter. This integration function is used to compensate for the differentiating influence of the input converters W1, W2, W3.

The analog filters limit the various pulses or signals and at the same time propagate them. Therefore, the signal becomes adulterated in magnitude/amount and angle, as a function of the frequency. This adulteration is compensated for in the device DS with the aid of an additional digital filter. This additional digital filter has an inverse transfer function to that of the analog filter. In this way, the influence of the filters on the transfer function in the lower frequency range is substantially eliminated.

The transfer function of the analog filters is as follows:

$$A(\omega) = \frac{1}{1 + j\omega RC}$$

A simulation of an RC member as a digital filter, with the aid of a bilinear transformation, furnishes the following transfer function for the Z range:

$$A(z) = \frac{\alpha_0}{1 - \beta_1 z^{-1}}$$

In order to compensate for the analog filter using the digital filter, an inverse transfer function is necessary as follows:

$$B(z) = \frac{1 - \beta_1 z^{-1}}{\alpha_0}$$

Since $A(z)$ and $A(\omega)$ only agree for very high scanning rates, a further adaptation must be performed with the aid of delay members. This means that the filter to be made must preferably be of a higher order. One example of a possible transfer function is shown below.

$$B(z) = \frac{1 - \beta_1 z^{-1} - \beta_2 z^{-2} - \beta_3 z^{-3} - \beta_4 z^{-4}}{\alpha_0 + \alpha_1 z^{-1} + \alpha_2 z^{-2} + \alpha_3 z^{-3} + \alpha_4 z^{-4}}$$

In this last equation, the symbols have the following meanings:
R=resistance
C=capacitance
ω=circuit frequency
α, β, z=coefficients The values for the various coefficients can be specified by one skilled in the art, by using the methods familiar to him or her.

Figure 2:
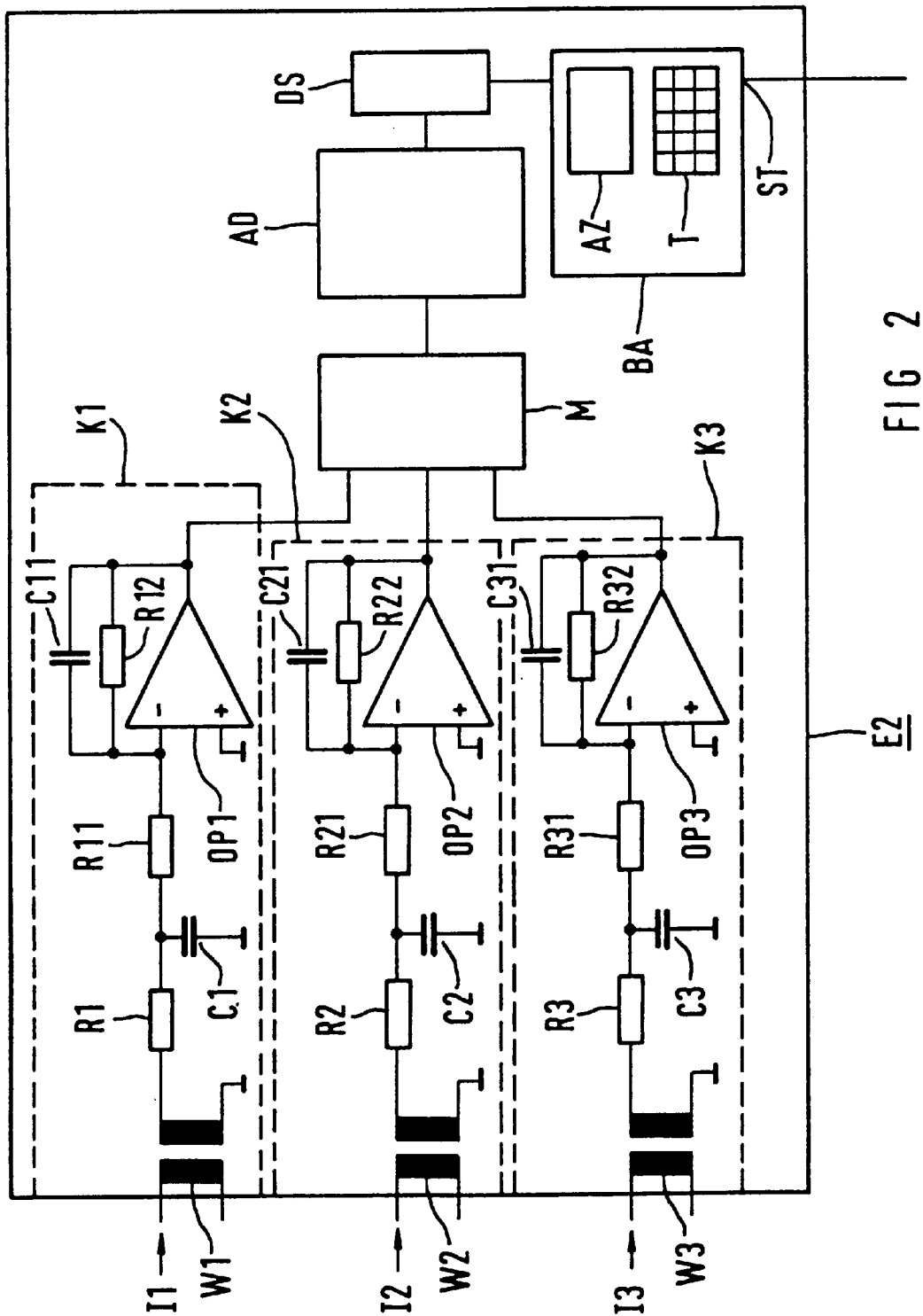
FIG. 2 is a schematic and block circuit diagram of a second electricity meter with second-order analog filters.

FIG. 2 shows another variant of an electricity meter E2, which in principle has the same layout as the electricity meter E1 of FIG. 1. In this case the operational amplifier OP4 is omitted for the sake of simplicity.

In this version, the channels K1, K2, K3 have a higher-order, in particular a second-order, band limitation filter as their filter. To that end, the low-pass filter with the resistor R1 and the capacitor C1 is followed by an operational amplifier OP1 with a voltage divider having resistors R11 and R12 and a positive feedback capacitor C11. In this way, the influence on low frequencies is very slight. Thus the drift in the capacitors, especially the capacitor C1, has only a slight effect on the resultant angle errors.

Figure 3:
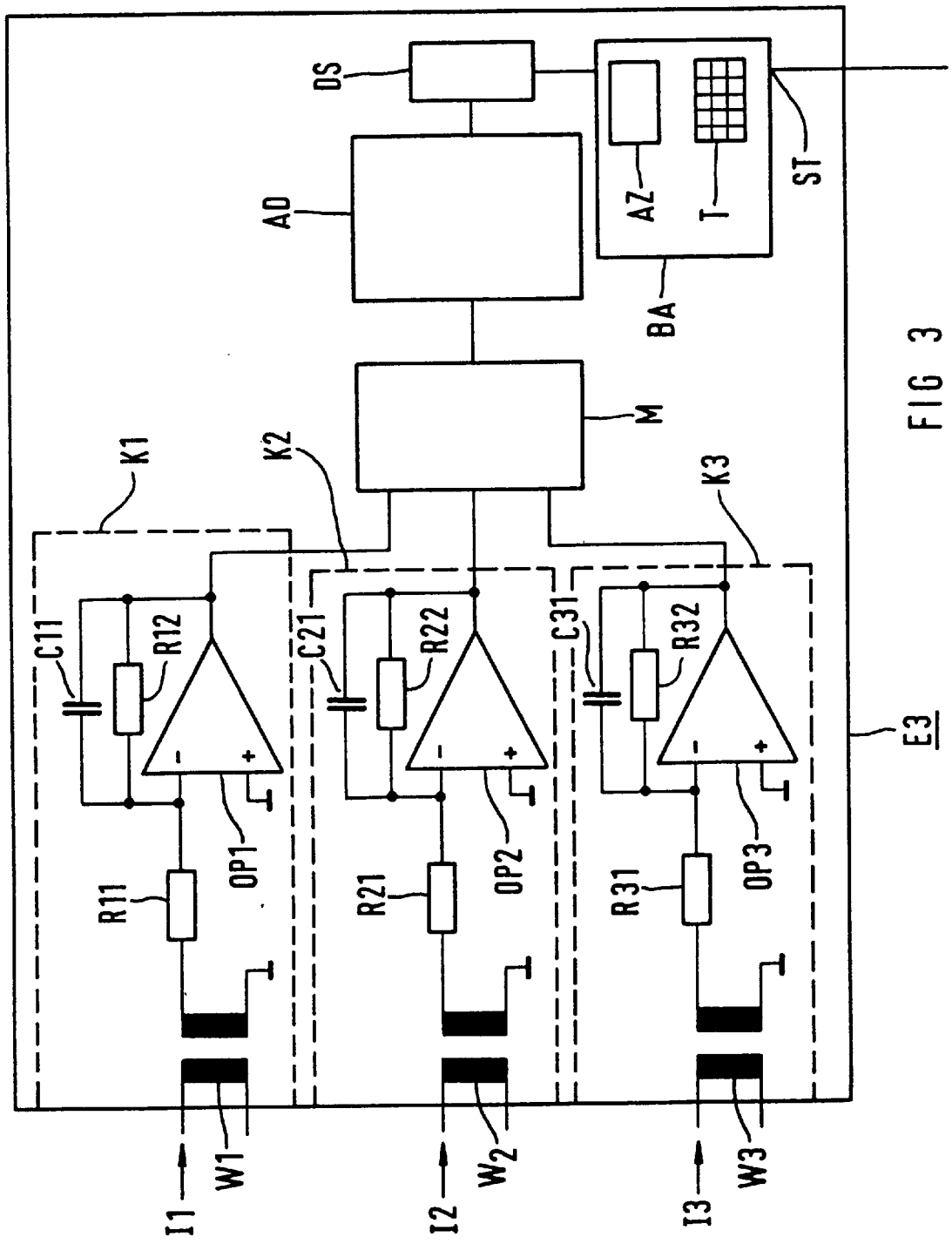
FIG. 3 is a schematic and block circuit diagram of a third electricity meter with level adaptation and impedance conversion.

FIG. 3 shows a further version of an electricity meter E3, which has a simplified layout as compared with the version of FIG. 2. Specifically, the components R1 and C1 are omitted in this case. Level adaptation and impedance conversion are possible with this version, which includes a first-order filter, as compared with the version of FIG. 1. This is attained by providing that the filter includes an active component, namely the operational amplifier OP1, as its amplifier.

Figure 4:
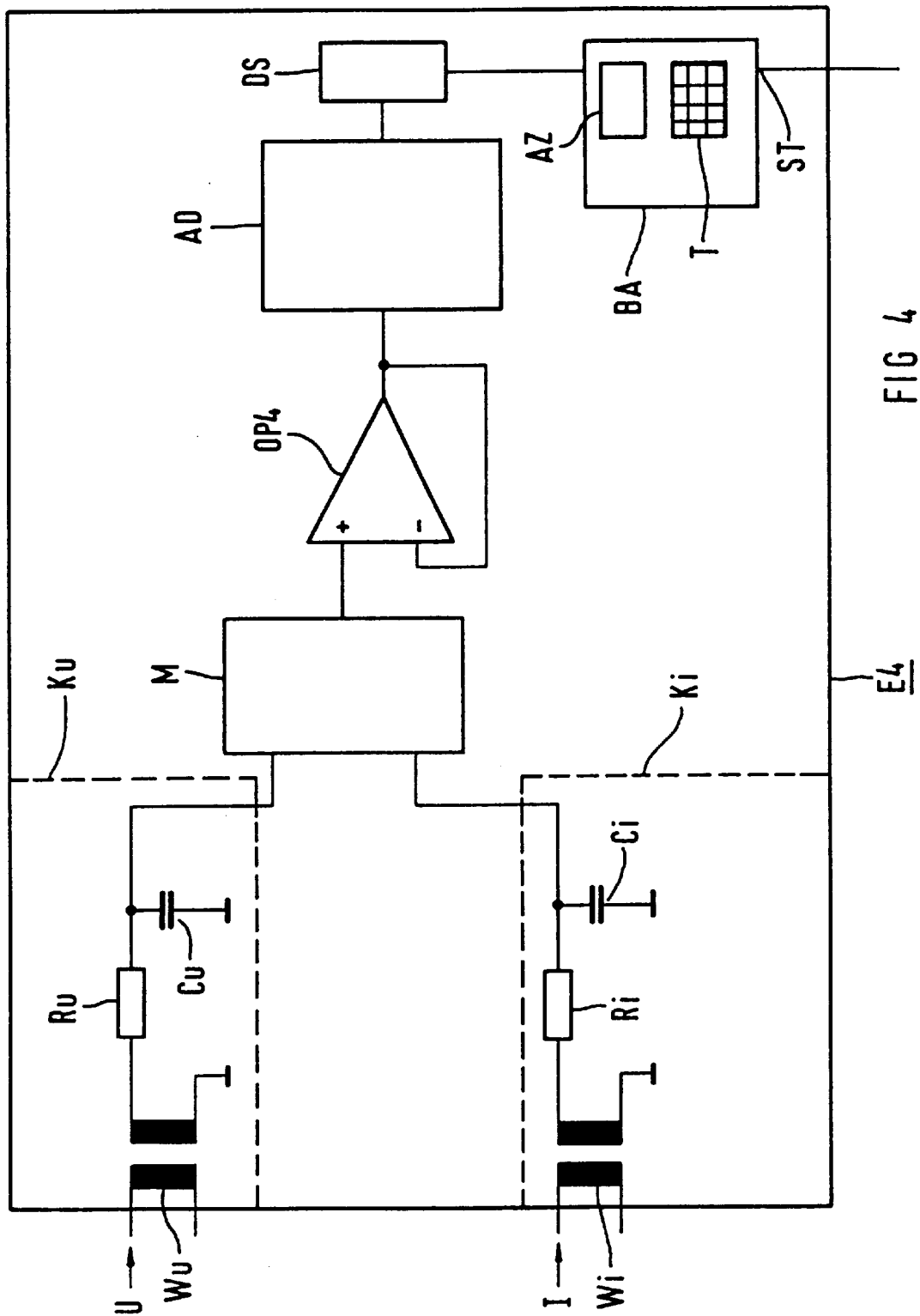
FIG. 4 is a schematic and block circuit diagram of a fourth electricity meter with analog filters in its voltage detection.

FIG. 4 shows an electricity meter E4 in accordance with the version E1 of FIG. 1, but in which voltage signals are processed in addition, for instance for energy measurement. Therefore, a voltage converter Wu supplies at least one digitized voltage signal U. An analog filter Ru, Cu is disposed downstream of the voltage converter Wu. For the sake of simplicity, only one voltage channel Ku and one current channel Ki are shown, which are carried to a common multiplexer M. It is understood that once again a separate channel formation with separate multiplexers and analog/digital converters is actually preferred. Both channels Kn and Ki have a first-order analog filter.

The analog filters are constructed in such a way that they cause the same phase displacement for the various signals. As a result, this signal adulteration need not be taken into account in the device DS, which thus economizes on computation time. The digital filter for compensating for the analog filter or filters need merely compensate in terms of the amount. This simplifies the compensation algorithm.

Preferably, a ΣΔ-modulator is used for the converter AD. It is distinguished by favorable properties for use in consumption measurement. Optimal adaptation with regard to processing time and accuracy can be achieved at the various kinds of signal processing by the specification of certain parameters. However, other embodiments are also possible.

We claim:

1. An electricity meter, comprising:
   at least one differentiating input converter;
   an analog/digital converter downstream of said at least one input converter;
   analog filters each connected between a respective one of said at least one input converter and said analog/digital converter, said analog filters having a given transfer function; and
   a device disposed downstream of said analog/digital converter for digital signal processing, said device for digital signal processing having a digital filter, said digital filter integrating a signal previously differentiated in said input converter and subsequently analog filtered and digitized, and said digital filter having a transfer function inverse to said given transfer function.

2. The electricity meter according to claim 1, wherein said analog filter is an active filter with an amplifier.

3. The electricity meter according to claim 1, wherein said analog filter is a low-pass filter.

4. The electricity meter according to claim 3, wherein said analog filter is an RC element.

5. The electricity meter according to claim 1, wherein said analog filter is at least a second order limiting filter.

6. The electricity meter according to claim 1, wherein said analog/digital converter is a sigma-delta converter.

7. The electricity meter according to claim 1, wherein said at least one differentiating input converter is at least three input converters each having an associated analog filter, for detecting a three-phase input signal.

8. The electricity meter according to claim 7, including a multiplexer connected between said analog filters and said analog/digital converter.

9. The electricity meter according to claim 1, wherein said device for digital signal processing includes a digital signal processor.

10. The electricity meter according to claim 1, wherein the differentiated signal is a duplicate of a current signal.

11. The electricity meter according to claim 1, wherein said at least one differentiating input converter is a voltage converter supplying at least one digitized voltage signal, said analog filter is disposed downstream of said voltage converter, said device for digital signal processing receives the at least one digitized voltage signal, and the at least one digitized voltage signal is carried to said digital filter in said device for digital signal processing.

12. The electricity meter according to claim 1, wherein said at least one differentiating input converter is a voltage converter supplying at least one digitized voltage signal, said analog filter is disposed downstream of said voltage converter, said device for digital signal processing receives the at least one digitized voltage signal, and the at least one digitized voltage signal is carried to a further digital filter in said device for digital signal processing.

13. The electricity meter according to claim 11, including three voltage converters for three-phase voltage detection.

14. The electricity meter according to claim 12, including three voltage converters for three-phase voltage detection.

15. The electricity meter according to claim 11, including an additional analog/digital converter for the voltage detection.

16. The electricity meter according to claim 12, including an additional analog/digital converter for the voltage detection.

17. The electricity meter according to claim 15, including a multiplexer preceding said additional analog/digital converter.

18. The electricity meter according to claim 16, including a multiplexer preceding said additional analog/digital converter.

* * * * *